(12) United States Patent  
Krieger et al.

(10) Patent No.: US 7,981,773 B2  
(45) Date of Patent: Jul. 19, 2011

(54) SWITCHABLE MEMORY DIODE—A NEW MEMORY DEVICE

(75) Inventors: Juri H. Krieger, Brookline, MA (US); Stuart Spitzer, Lynnfield, MA (US)

(73) Assignee: Spansion LLC, Sunnyvale, CA (US)

( * ) Notice: Subject to any disclaimer, the term of this patent is extended or adjusted under 35 U.S.C. 154(b) by 69 days.

(21) Appl. No.: 12/470,825

(22) Filed: May 22, 2009

(65) Prior Publication Data

US 2009/0233422 A1 Sep. 17, 2009

Related U.S. Application Data

(62) Division of application No. 11/616,045, filed on Dec. 26, 2006, now Pat. No. 7,550,761, which is a division of application No. 10/883,350, filed on Jul. 1, 2004, now Pat. No. 7,157,732.

(51) Int. Cl.  
*H01L 21/20* (2006.01)

(52) U.S. Cl. .............. 438/478; 438/82; 438/99; 257/40; 257/642; 257/E21.024; 257/E51.023

(58) Field of Classification Search .................... 438/82, 438/99, 478; 257/40, 642, E21.024, E51.023  
See application file for complete search history.

(56) References Cited

U.S. PATENT DOCUMENTS

| | | | |
|---|---|---|---|
| 6,272,038 B1 | 8/2001 | Clausen et al. | |
| 6,608,773 B2 | 8/2003 | Lowrey et al. | |
| 6,656,763 B1 | 12/2003 | Oglesby et al. | |
| 6,806,526 B2 | 10/2004 | Krieger et al. | |
| 6,847,047 B2 | 1/2005 | VanBuskirk et al. | |
| 2003/0053350 A1 | 3/2003 | Krieger et al. | |
| 2003/0173612 A1 | 9/2003 | Krieger et al. | |
| 2004/0026714 A1 | 2/2004 | Krieger et al. | |
| 2004/0084670 A1 | 5/2004 | Tripsas et al. | |
| 2004/0159835 A1 | 8/2004 | Krieger et al. | |
| 2004/0160801 A1 | 8/2004 | Krieger et al. | |
| 2004/0256694 A1* | 12/2004 | Kostylev et al. | ............... 257/536 |

FOREIGN PATENT DOCUMENTS

WO 2004/042738 A1 5/2004

OTHER PUBLICATIONS

International Search Report dated Nov. 4, 2005 mailed Nov. 10, 2005 for PCT Application Serial No. PCT/US2005/023313, 5 Pages.  
Krieger et al., "Non-traditional, Non-volatile Memory Based on Switching and Retention Phenomena in Polymeric Thin Films", Nov. 15-17, 2004, pp. 121-124.  
OA Dated Sep. 11, 2008 for U.S. Appl. No. 11/616,045, 18 pages.

* cited by examiner

*Primary Examiner* — Andy Huynh  
(74) *Attorney, Agent, or Firm* — Turocy & Watson, LLP

(57) ABSTRACT

Systems and methodologies are provided for forming a diode component integral with a memory cell to facilitate programming arrays of memory cells created therefrom. Such a diode component can be part of a PN junction of memory cell having a passive and active layer with asymmetric semiconducting properties. Such an arrangement reduces a number of transistor-type voltage controls and associated power consumption, while enabling individual memory cell programming as part of a passive array. Moreover, the system provides for an efficient placement of memory cells on a wafer surface, and increases an amount of die space available for circuit design.

16 Claims, 11 Drawing Sheets

US 7,981,773 B2

SWITCHABLE MEMORY DIODE—A NEW MEMORY DEVICE

CROSS REFERENCE TO RELATED APPLICATIONS

This application is a divisional of U.S. patent application Ser. No. 11/616,045, filed on Dec. 26, 2006, entitled "SWITCHABLE MEMORY DIODE—A NEW MEMORY DEVICE," which is a divisional of U.S. patent application Ser. No. 10/883,350 (now U.S. Pat. No. 7,157,732), filed Jul. 1, 2004, entitled "SWITCHABLE MEMORY DIODE—A NEW MEMORY DEVICE." The entirety of the aforementioned applications is incorporated by reference herein.

TECHNICAL FIELD

This disclosure relates generally to a memory cell with a diode integral therewith.

BACKGROUND

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, or the like). Memory cells can be typically employed in various types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices which are often, but not always, short term storage mediums.

Also, memory cells can generally be subdivided into volatile and non-volatile types. Volatile memory cells usually lose their information if they lose power and typically require periodic refresh cycles to maintain their information. Volatile memory cells include, for example, random access memory (RAM), DRAM, SRAM and the like. Non-volatile memory cells maintain their information whether or not power is maintained to the devices. Examples of non-volatile memory cells include; ROM, programmable read only memory (PROM), erasable programmable read only memory (EPROM), electrically erasable programmable read only memory (EEPROM), flash EEPROM the like. Volatile memory cells generally provide faster operation at a lower cost as compared to non-volatile memory cells. Nonetheless, to retain the information, the stored data typically must be refreshed; that is, each capacitor must be periodically charged or discharged to maintain the capacitor's charged or discharged state. The maximum time allowable between refresh operations depends on the charge storage capabilities of the capacitors that make up the memory cells in the array. The memory device manufacturer typically specifies a refresh time that guarantees data retention in the memory cells.

As such, each memory cell in a memory device can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase speed and storage retrieval for memory devices (e.g., increase write/read speed). At the same time, to reach high storage densities, manufacturers typically focus on scaling down semiconductor device dimensions (e.g., at submicron levels). Nonetheless, formation of various transistor type control devices that are typically required for programming memory cell arrays increases costs and reduces efficiency of circuit design.

The above-described deficiencies of today's memory device techniques and related technologies are merely intended to provide an overview of some of the problems of conventional systems, and are not intended to be exhaustive. Other problems with the state of the art and corresponding benefits of some of the various non-limiting embodiments may become further apparent upon review of the following detailed description.

SUMMARY

The following presents a simplified summary of the innovation to provide a basic understanding of some aspects described herein. This summary is not an extensive overview of the disclosed subject matter. It is not intended to identify key or critical elements of the disclosed subject matter or delineate the scope of the subject innovation. Its sole purpose is to present some concepts of the disclosed subject matter in a simplified form as a prelude to the more detailed description that is presented hereinafter.

The subject disclosure provides for systems and methods for forming diode elements integral with a memory, wherein a diode element employs an active layer (e.g. a polymer layer), and a passive layer (e.g. a super-ionic thin film), with asymmetric P/N characteristics to create a diode function. Such diode components can mitigate power consumption for memory cell arrays, and further provide for isolation of memory cells from one another, to enable an individual programming of a memory cell as part of the array.

According to one aspect of the subject disclosure, the active and passive layer arrangement can form a component with two terminals that exhibits properties of a switchable "ON" or forward diode element with electrical isolation characteristics, which at the same time can be integral with a memory cell. The active layer can comprise: organic (e.g. conjugated polymer and related chemical compounds with N or P type properties), non-organic material, semiconducting material, and various inclusion compounds (e.g. Ti Se2). The passive and active layer can be sandwiched between ohmic contact planes. In addition, the active layer can be doped to achieve desired resistivity properties, and enable a typically precise adjustment of required threshold properties associated with the diode element. Employing the diode elements of the subject disclosure can reduce a number of transistor-type voltage controls. Moreover, an efficient placement of polymer memory cell on a wafer surface can be obtained that increases an amount of die space available for circuit design.

In one exemplary aspect of the subject disclosure, the diode component can be employed as part of an array for memory cells. The active layer can be a polymer layer, and the passive layer a thin film layer of super ionic material that facilitates the supply and acceptance of ions, and/or migration of electrons and holes. The active and passive layer can be sandwiched between ohmic contacts (e.g., linear voltage-current relation), which can additionally supply ions for the passive layer. As such, state change voltages can then be applied to a single memory cell as part of the array for a programming thereof to a desired state. The thickness and composition of the diode element can dictate the required threshold voltage.

In accordance with an aspect of the subject disclosure, the diode component can enable fabrication of a passive array of memory cells—wherein a number of transistors required for memory cells is greatly reduced—by enabling individual memory cells to be programmed. Accordingly, a size of an array employing the diode component of the subject disclosure can be significantly condensed. Like wise, power consumption for such an array can be significantly lowered.

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Figure 1:
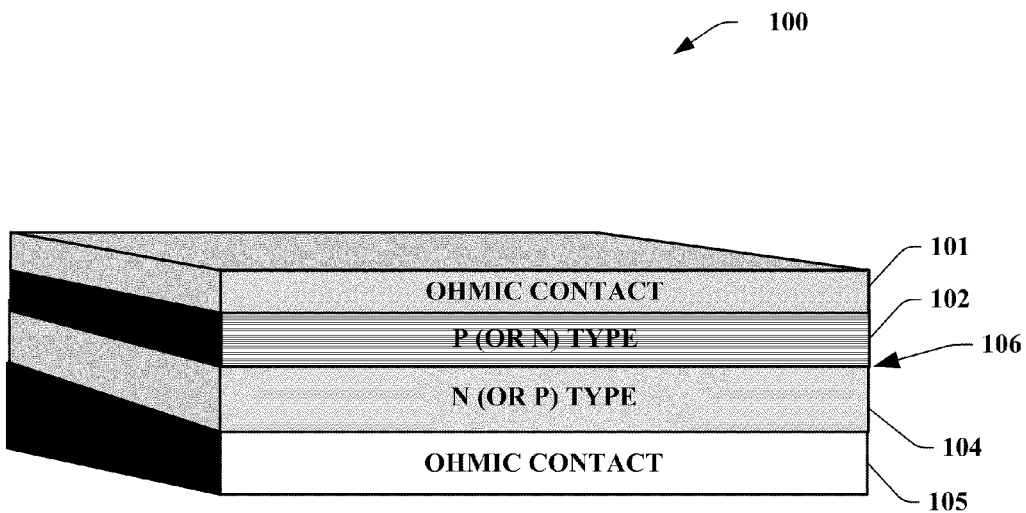
FIG. 1 illustrates a diode element integral to a memory cell, in accordance with an embodiment.

The subject disclosure provides for systems and methods of forming a diode element with (e.g. a two terminal diode component) by employing an active layer and a passive layer, wherein the passive layer and the active layer have opposite P/N characteristics to create a diode junction. Referring initially to FIG. 1, a diagram of a diode element is illustrated according to one aspect of the subject disclosure. The diode element 100 includes an active layer 102 and a passive layer 104 (e.g. a super ionic thin film) that are sandwiched between two ohmic contact planes, for example, in a form of two exterior electrode connections. The active layer and the passive layer have opposite P/N functionalities, and create a diodic junction 106. Such diodic junction can also be created between the active layer 102 and the passive layer 104, for example, due to a difference in work function between the materials of the two layers; and/or due to a charge exchange between the two layers 102 and 104.

The active layer 102 can change an impedance state (e.g. from a high resistance to a low resistance) when subject to a stimulus such as a voltage or current. Such active layer can be comprised of organic, non organic, and inclusion compounds, (e.g. $TiSe_2$). In addition, an active molecule or molecular group that forms the active layer can be one that changes a property when subjected to an electrical field and/or light radiation, (e.g. iozinable group); such as: nitro group, amino group, cyclopentadienyl, dithiolane, metilcyclopentadienyl, fulvalenediyl, indenyl, fluorenyl, cyclobis(paraquart-p-phenylene), bipyridinium, phenothiazine, diazapyrenium, benzonitrile, benzonate, benzamide, carbazole, dibenzothiophene, nitrobenzene, aminobenzenesulfonate, amonobenzanate, and molecular units with redox-active metals; metallocenes (Fe, V, Cr, Co, Ni and the like) complex, polypyridine metal complex (Ru, Os and the like).

In another aspect of the subject disclosure, the active layer 102 can include polymers such as polyaniline, polythiophene, polypyrrole, polysilane, polystyrene, polyfuran, polyindole, polyazulene, polyphenylene, polypyridine, polybipyridine, polyphthalocyanine, polysexithiofene, poly(siliconoxohemiporphyrazine), poly(germaniumoxohemiporphyrazine), poly(ethylenedioxythiophene) and related derivatives with active molecular group. It is to be appreciated that other suitable and related chemical compounds can also be employed including: aromatic hydrocarbons; organic molecules with donor and acceptor properties (N-Ethylcarbazole, tetrathiotetracene, tetrathiofulvalene, tetracyanoquinodimethane, tetracyanoethylene, cloranol, dinitro-n phenyl and so on); metallo-organic complexes (bisdiphenylglyoxime, bisorthophenylenediimine, tetraaza-tetramethylannulene and so on); porphyrin, phthalocyanine, hexadecafluoro phthalocyanine and their derivatives with active molecular group, so long as opposite P/N functionality between the active layer 102, and passive layer 104 is maintained to create the diodic junction 106.

In a related aspect of the subject disclosure, the active layer can comprise; polymer polyphenilacetylene+molecules of chloranil or tetracyano-quino-dimethane or dichlordicyanoquinone, (which can be deposited from solution by spin-coating); copper phthalocyanine (which can be deposited by thermal deposition method to about 30 Å-1000 Å); copper hexadecafluoro phthalocyanine, amorphous carbon or palladium, (which can be deposited on the upper surface of the active layer by magnetron co-sputtering); and polysilanes with N-carbazolylpropyl group; polymer polytiophene with cyclopentadienyl groups, (which can be deposited from solution by spin-coating; polisilanes with N-carbazolylpropyl group); polysilanes with cyclopentadienyl groups; polysilanes with amino groups; polytiophene with alkyl amino groups; polytiophene with cyclopentadienyl alkyl groups; composite containing polydiphenilacetylene containing carbazolyl groups and dinitro-n-phenyl (DNP); polyethylenedioxythiophene, and porous ferroelectric (polyvinyline fluoride) containing Li $CF_3$ $SO_3$ salt, polydiphenilacetylene containing carbazolyl groups dinitro-n-phenyl (DNP); polyethylenedioxythiophene and salt of potassium hexycyanoferrate. As such, so long as opposite P/N functionality between the active layer 102, and passive layer 104 is maintained the diodic junction 106 of the subject disclosure can be created.

As depicted in FIG. 1, the active layer 102 can be formed over the passive layer 104, to create a diode interface therebetween. The active layer 102 can be shaped via a number of suitable techniques. One such technique involves growing the active layer 102 in the form of an organic layer from the passive layer 104. Another technique can be a spin-on technique that involves depositing a mixture of the material and a solvent, and then removing the solvent from the underlying substrate or electrode. Likewise, chemical vapor deposition (CVD) techniques can also be employed. Typically, CVD can include low pressure chemical vapor deposition (LPCVD), plasma enhanced chemical vapor deposition (PECVD), and high density chemical vapor deposition (HDCVD).

In a related aspect of the subject disclosure, the active layer 102 can also be comprised of a conjugated organic material, such as a small organic molecule and a conjugated polymer. If the organic layer is polymer, a polymer backbone of the conjugated organic polymer may extend lengthwise between the ohmic contact plane 101 and 105 (e.g., generally substantially perpendicular to the inner, facing surfaces of the ohmic contact planes). The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials facilitates control of properties associated with the diode.

In this connection, the conjugated organic material of the active layer 102 has the ability to donate and accept charges (holes and/or electrons). Generally, the conjugated organic molecule has at least two relatively stable oxidation-reduction states. The two relatively stable states permit the conjugated organic polymer to donate and accept charges, when interacting with the oppositely charged passive layer. Moreover when employing CVD techniques, it is not generally necessary to functionalize one or more ends of the organic molecule in order to attach it to the passive layer 104. Sometimes such organic molecules can have a chemical bond formed between the conjugated organic polymer of the active layer 102 and the passive layer 104.

In one particular aspect of the subject disclosure, the organic material employed as part of the active layer can be cyclic or acyclic. For some cases, such as organic polymers, the organic material can self assemble during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; poly(p-phenylene)s; poly(imide)s; polymetallocenes such as polyferrocenes, polyphthalocyanines; polyvinylenes; polystiroles; and the like. Additionally, the properties of the organic material can be modified by doping with a suitable dopant.

The organic layer, which in one exemplary aspect can form the active layer 102, has a suitable thickness that depends upon the chosen implementations of the diode being fabricated. Some suitable exemplary ranges of thickness for the organic polymer layer, which in part can form the active layer 102, are about 0.001 m or more and about 5 m or less, about 0.01 m or more and about 2.5 m or less, and about a thickness of about 0.05 m or more and about 1 m or less. Similarly, the passive layer 104 can have a suitable thickness that can vary based on the implementation of the diode being fabricated. Some examples of suitable thicknesses for the passive layer 104 can be: a thickness of about 2 Å or more and about 0.1 m or less, a thickness of about 10 Å or more and about 0.01 m or less, and a thickness of about 50 Å or more and about 0.005 m or less.

According to one aspect of the subject disclosure, the passive layer can be deposited upon the ohmic contact layer 105 via vacuum thermal evaporation, sputtering, or plasma enhanced chemical vapor deposition (PECVD) utilizing a metal organic (MO) precursor. The deposition process can be monitored and controlled to facilitate, among other things, depositing the conductivity facilitating compound to a desired thickness.

Additionally, the passive layer 104 facilitates charge carrier (e.g., electrons or holes) and/or metal ion injection into the active layer 102 and increases the concentration of the charge carrier and/or metal ions in the active layer 102 that can modify the conductivity of the active layer 102.

The passive layer 104 contains at least one conductivity facilitating compound that has the ability to donate and accept charges (holes and/or electrons). Generally, the conductivity facilitating compound has at least two relatively stable oxidation-reduction states that can permit the conductivity facilitating compound to donate and accept charges. Passive layer 104 should also be capable of donating and accepting ions. Examples of other conductivity facilitating compounds that can be employed for the passive layer 104 include one or more of the following: tungsten oxide ($WO_3$), molybdenum oxide ($MoO_3$), titanium selenide (Ti $Se_2$), and the like.

The passive layer 104 can in some instances act as a catalyst when forming the active layer 102. In this connection, a backbone of a conjugated organic molecule can initially form adjacent the passive layer 104, and grow or assemble away and substantially perpendicular to the passive layer surface. As a result, the backbones of the conjugated organic molecule can be self aligned in a direction that traverses the two ohmic contact planes (e.g. electrodes.) The passive layer 104 can be formed by a deposition process (e.g. thermal deposition, PVD, non-selective CVD, and the like) or by a complete sulfidation of pre-deposited thin Cu layer.

Figure 2:
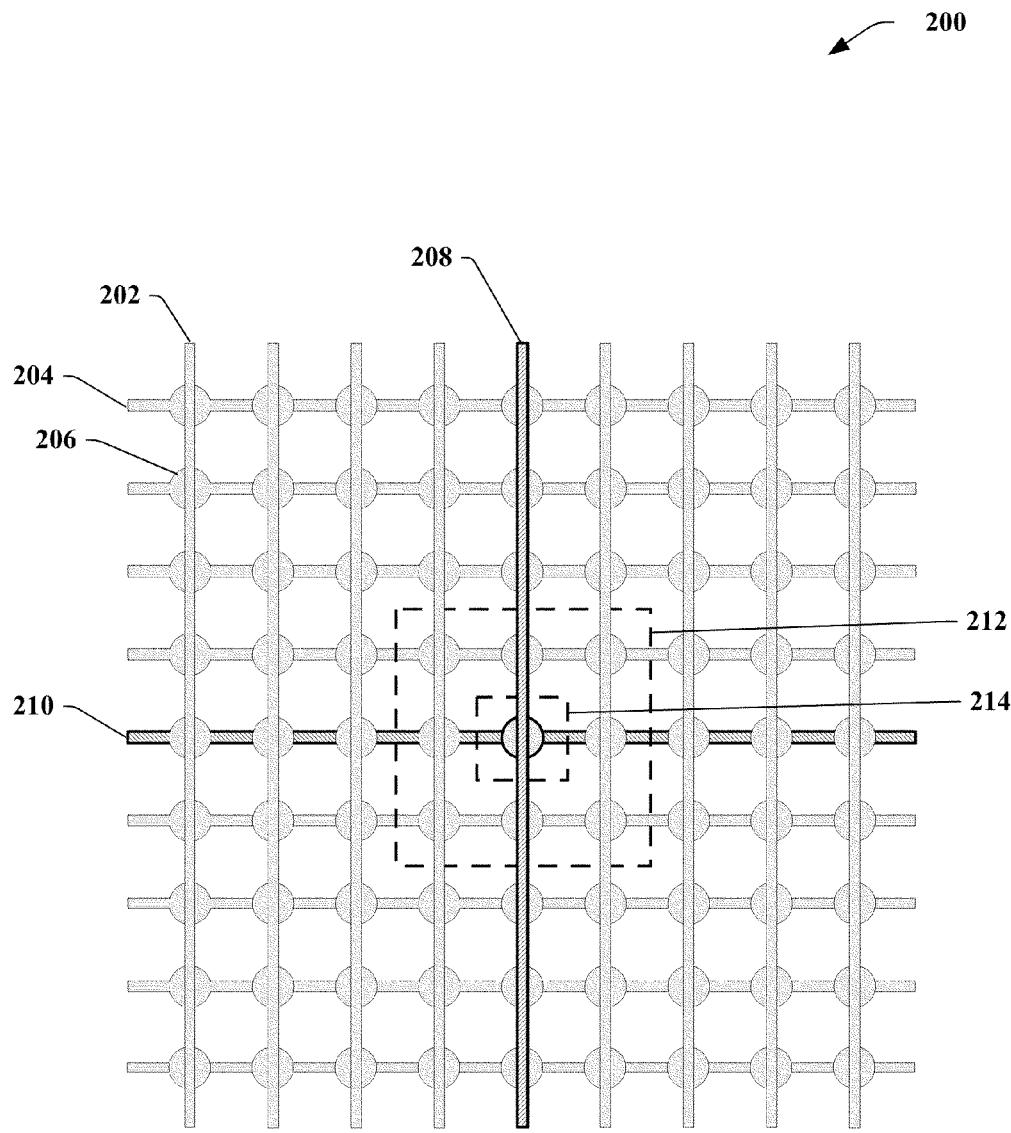
FIG. 2 is a diagram of a memory array that employs integral diodes, in accordance with an embodiment.

Turning now to FIG. 2, a top view of a semiconductor device array 200 that employs diode elements in accordance with an aspect of the subject disclosure is depicted. Such an array is generally formed on a silicon based wafer, and includes a plurality of columns 202, referred to as bitlines, and a plurality of rows 204, referred to as wordlines. Such bit lines and wordlines can be connected to the top and bottom metal layers of memory components. The intersection of a bitline and a wordline constitutes the address of a particular memory cell. Data can be stored in the memory cells (e.g., as a 0 or a 1) by choosing and sending signals to appropriate columns and rows in the array (e.g., via a column address strobe CAS 206 and a row address strobe RAS 208, respectively.) The diode element of the subject disclosure mitigates requirements of employing transistors-capacitor pairs when programming memory cells in such array.

For example, when a memory cell 214 has been chosen to be programmed, the appropriate bitline 208 and wordline 210 that intersect the memory cell 214 are energized to an appropriate voltage level necessary for the desired function (e.g. read, write, erase). Even though other memory cells exist along bitline 208 and wordline 210, only the cell 214 at the intersection of the appropriate bitline 208 and wordline 210 actually changes to the appropriate state. For example, it can be the combination of the two voltage level changes that alters the memory cell 214 state. The bitline voltage level alone and the wordline voltage level alone are not enough to program the other devices connected to these lines. Accordingly, only the device 214 that is connected to both lines can surpass the threshold voltage levels set by the diode element integral to a memory cell of the subject disclosure. Thus, diode elements of other bitlines and wordlines can be tuned such that memory cells are typically undisturbed during the processes. Such embedding of the diode element with the memory cell mitigates a number of transistor-type voltage controls as part of programming memory cells of an array, e.g. reducing a number of discrete or external diodes, which can require a different layering. Accordingly, a diode built integrally with a memory element can be fabricated enabling an efficient placement of memory cells on a wafer surface, while increasing an amount of die space available for circuit design.

Figure 3:
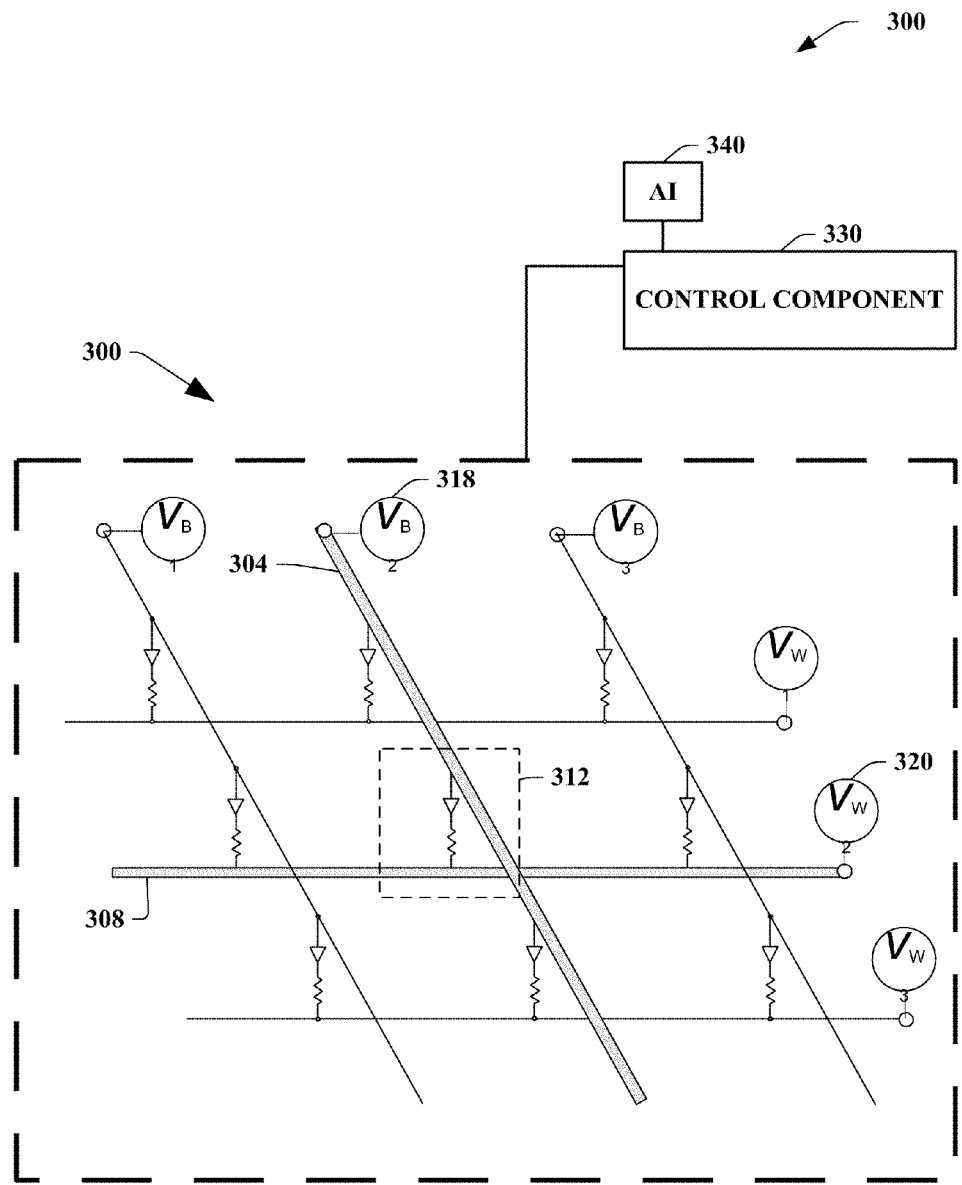
FIG. 3 illustrates a schematic memory cell array with integral diodes, in accordance with an embodiment.

FIG. 3 illustrates another schematic diagram of a memory array in accordance with an aspect of the subject disclosure. Array 300 is depicted with diode components that are integral to memory cells to be programmed (e.g. diode 312 integral with its memory cell). A plurality of voltage sources (e.g. 318, 320) can operate on various bitlines (e.g. 304) and wordlines (e.g. 308) for changing a state of designated memory cells. A control component 330 can regulate such voltage sources, and program desired memory cells to a designated value, (e.g. program memory cell with its integral diode 312), while mitigating employment of transistor type elements. The control component can further include an artificial intelligence component 340 for programming of memory cells.

For example, the programming can be facilitated via an automatic classification system and process. Such classification can employ a probabilistic and/or statistical-based analysis (e.g., factoring into the analysis utilities and costs) to prognose or infer an action that is desired to be automatically performed. For example, a support vector machine (SVM) classifier can be employed. A classifier is typically a function that maps an input attribute vector, x=(x1, x2, x3, x4, xn), to a confidence that the input belongs to a class—that is, f(x) =confidence (class). Other classification approaches include Bayesian networks, decision trees, and probabilistic classification models providing different patterns of independence can be employed. Classification as used herein also is inclusive of statistical regression that is utilized to develop models of priority.

It is to be appreciated that the subject invention can employ classifiers that are explicitly trained (e.g., via a generic training data) as well as implicitly trained (e.g., via observing system behavior, receiving extrinsic information) so that the classifier(s) is used to automatically determine according to a predetermined criteria which regions to choose. For example, with respect to SVM's—it is to be appreciated that other classifier models may also be utilized such as Naive Bayes, Bayes Net, decision tree and other learning models —SVM's are configured via a learning or training phase within a classifier constructor and feature selection module.

The following discussion relates to typical operation of a diode element that can provide a helpful discussion to understanding various aspects of the subject disclosure. Typically, a diode is a two-region device separated by a junction. It either allows current to pass or prohibits it. Whether the current is allowed to pass is determined by the voltage level and polarity, referred to as biasing. Generally, when the polarity of the applied voltage matches the polarity of the diode region at the junction, the diode is considered to be forward biased, permitting the current to flow. When the polarities are opposing, the diode is considered to be reverse biased, inhibiting the current flow. Current flow in a reverse biased diode can be achieved by raising the applied voltage to a level that forces the junction into breakdown. The current flow can once again stop when the applied voltage level is reduced below the level required to cause breakdown.

In general, the relationship between the current and voltage can be expressed using the ideal diode equation:

$$I_D = I_S \left( e^{\frac{qV_D}{nkT}} - 1 \right)$$

where $I_D$ is the current through the diode and $V_D$ is the voltage across the diode. Additionally, $I_S$ is the reverse saturation current (the current that flows through the diode when it is reverse biased—$V_D$ is negative), q is the electronic charge ($1.602 \times 10^{-19}$ C), k is Boltzmann's constant ($1.38 \times 10^{-23}$ J/° K), T=junction temperature in Kelvins, and n is the emission coefficient.

Although a reverse biased diode is ideally non-conducting, a small current still flows through the semiconductor junction when the voltage is applied due to the presence of minority carriers. The total reverse current can be approximated by:

$$J_S = q \sqrt{\frac{D_p}{\tau_p}} \frac{n_i^2}{N_D} + \frac{q n_i W}{\tau_n}$$

where $D_p$ is the hole diffusion coefficient, $\tau_p$ and $\tau_n$ are the effective lifetime constants of the holes and the electrons in a depletion region. The reverse current is the sum of the diffusion component in the neutral region and the generation current in the depletion region. The diffusion current is due to the change in concentration of the charges through the material. The second term comes from the emission of charges through the deep levels present within an energy band gap. Additionally, W is the width of the depletion region, $n_i$ is the intrinsic density and $N_D$ is the donor density.

The work functions of the two materials used to form a diodic junction determine the potential barrier formed at the junction. The work function is defined as the energy difference between the vacuum level and the Fermi level, EF. As an example, assume a metal layer and an n-type semiconductor layer are used to form the diodic layer of the subject disclosure. Therefore, the work function of the metal layer is denoted by q m and the semiconductor layer is denoted q(+Vn), where the electron affinity of the semiconductor, is the difference in energy between the bottom of the conduction band, EC, and the vacuum level. Additionally, qVn is the difference between EC and the Fermi level.

For example, when a metal and a semiconductor layer come in contact, a charge can flow from the semiconductor to the metal. Typically, the semiconductor can be n-type, so its work function is smaller than the metal work function. As the distance between the two layers decreases, an increasing negative charge is built up at the metal surface. At the same time, an equal and opposite charge exists in the semiconductor. When the distance between the layers is comparable with the interatomic distance, the gap becomes transparent to electrons. The limiting value for the barrier height q Bn is given by:

$$q\phi_{Bn} = q(\phi_m - \chi).$$

The barrier height is then the difference between the metal work function and the electron affinity of the semiconductor. It is to be appreciated that the formulas discussed supra provide a basic understanding for various attributes of a diodic layer. One skilled in the art can appreciate that the above discussion provides a basic understanding of diodic properties.

Figure 4:
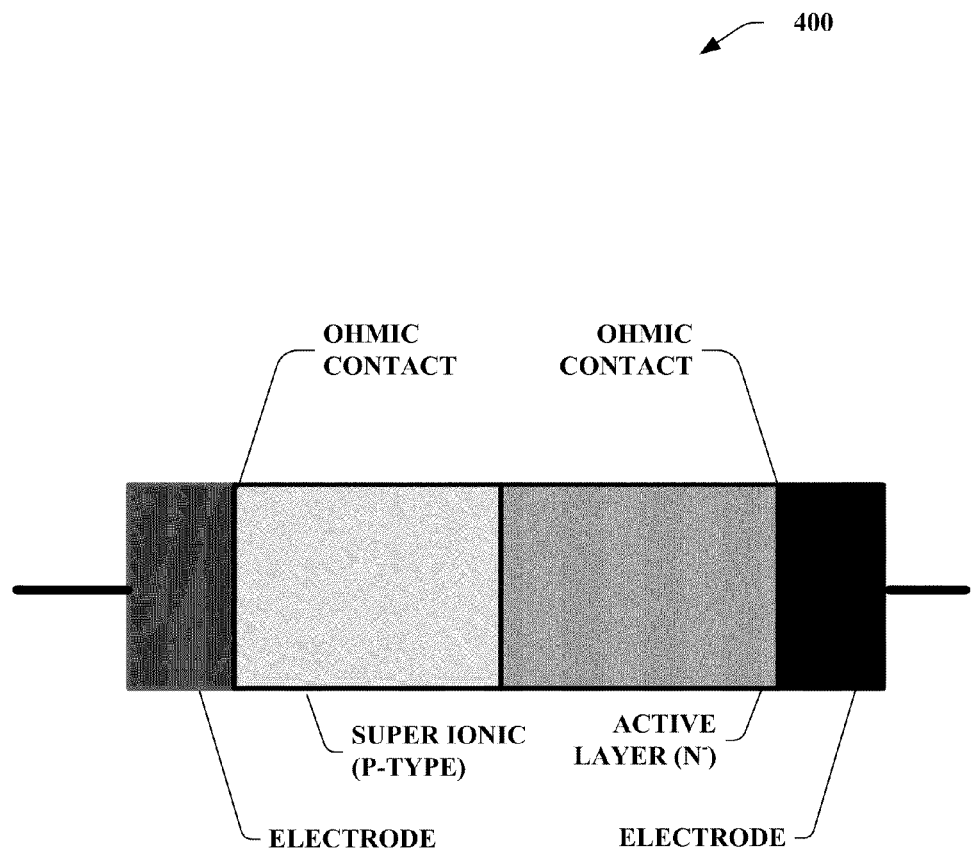
FIG. 4 illustrates a diagram of a particular memory cell with a switchable diode integrated therewith in an off state, in accordance with an embodiment.

Turning to FIG. 4, a diagram depicting a particular memory cell with a switchable diode integrated therewith in an off state is illustrated, in accordance with an embodiment. The OFF state represents a state wherein resistance of the device is high, and typically no carriers are available for charge exchange between active and passive layer. Such exemplary memory cell includes a super ionic (passive) layer that can exhibit N⁻ characteristics and an active layer with P type characteristics, as described in detail supra. It is to be appreciated that the invention is not so limited, and other arrangements (e.g., a passive layer with P type characteristics and active layer with N type characteristics) are also within the realm of the subject disclosure. The active layer can be a lightly doped layer, which is doped via a suitable doping technique (e.g., arsenic doped, phosphorous doped, and the like.) Ohmic contacts that typically provide for good electrical contacts are also provided as part of the electrode connections. Such an arrangement provides a PN junction that is integrated as part of a switchable memory device.

Figure 5:
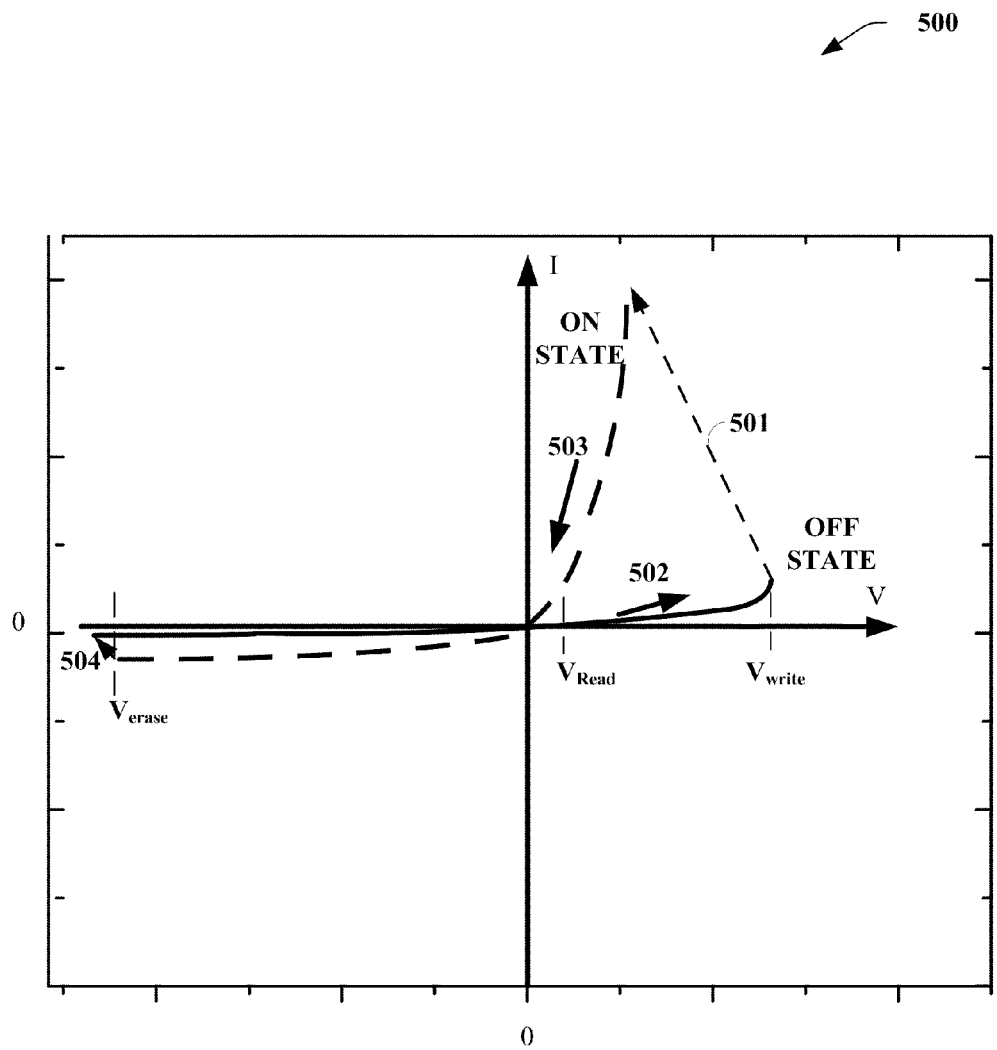
FIG. 5 illustrates an exemplary current-voltage graph 500 for a diode integral to the memory cell, during "On" and "Off" states, in accordance with an embodiment.

FIG. 5 illustrates an exemplary current-voltage graph 500 for a diode integral to the memory cell, during "On" and "Off" states, in accordance with an embodiment. As illustrated, an arbitrary current requires a higher voltage for an "OFF" state, when compared to an "On" state. The "On" and "Off" states can be distinguished by choosing a current and measuring a respective voltage and vice versa. Accordingly, employing the diode according to the subject disclosure facilitates blocking of current in the negative voltage direction—absent a diode integral with a memory cell, the memory cell can exhibit an I-V graph that is symmetrical with respect to the point of origin (not shown). Such blocking of power in a stand by or neutral state of a memory device reduces power consumption and can further enable a programming of desired memory cell as part of an array, as explained supra.

As illustrated, slope of line 501 typically reflects the current limiting resistance of the circuit (e.g., reflecting a load line that can be varied by a combination of the applied voltage and a resistance in series with the memory component.) Such line depicts a typically transitional state when switching the device.

If the voltage is increased in a direction of the arrow 502 by tracing the "OFF" state (solid curve) such that the a write voltage threshold (Vwrite) is obtained, the memory cell with integrated diode device then switches from an "OFF" state of low resistance to an "ON" state of high resistance. Subsequently, a decrease of voltage traces in a direction of arrow 503 into negative voltage values following a path of the ON state (dashed curve) representing diode characteristics, and reverse leakage current. Thereafter, an erase voltage threshold point (Verase) can be obtained that can then switch the device from an "ON" state to an "OFF" state as depicted by arrow 504. Nonetheless, if before reaching such erase threshold voltage the voltage is reversed the I-V trace will retrace back on the "ON" state curve in a direction opposite the arrow 503. Moreover, if the erase threshold is surpassed in the negative voltage direction, any voltage reversal typically will follow the "OFF" state curve, and the corresponding threshold write voltage will be increased. A read threshold voltage can be positioned any place in between Verase and Vwrite, and can be typically positioned such that a low power consumption be required for a read operation. Generally, the write voltage can be between 1 to 10 volts, and the erase voltage between −0.5 to −5 volts depending upon fabrication of the polymer memory cell and programming methodologies. It is to be appreciated that depending upon the load resistance and manner of limiting the current, a family of curves (not shown) can be obtained that pass through predetermined points on line 501, to define other ON states with different resistances, and hence providing for a multi bit operation of the device. Accordingly, a plurality of ON states can be defined for a memory cell.

Figure 6:
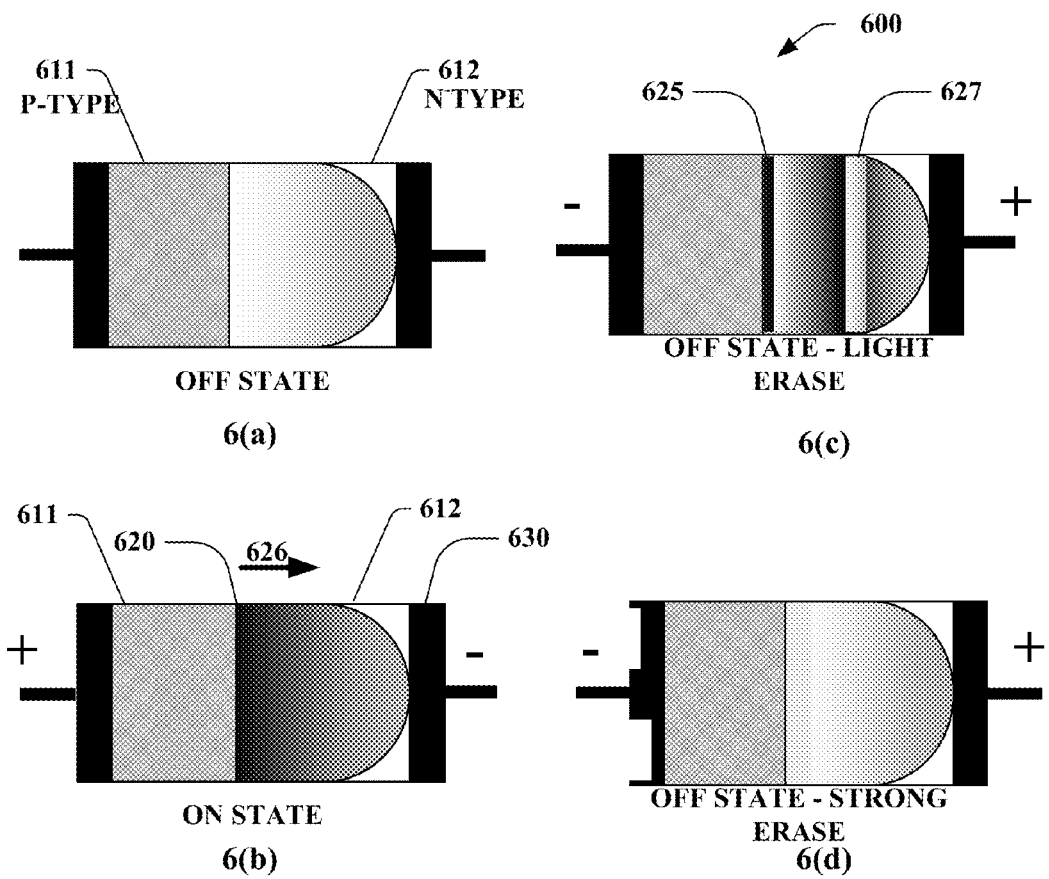
FIGS. 6a thru 6d illustrate concentration of ions at the various stages of operation for the switchable diode with a memory illustrated in FIG. 4, in accordance with an embodiment.
Figure 6:
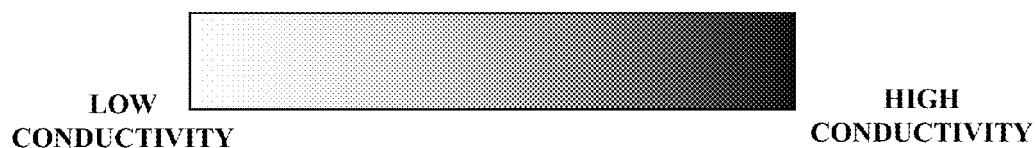

FIG. 6a thru FIG. 6d illustrates concentration of ions at the various stages of operation for the switchable diode with memory illustrated in FIG. 4. FIG. 6a illustrates a concentration of ions in an OFF state, after an initialization process that can invite a limited amount of ions in the active layer. Subsequently, the device is brought into an ON state at 6b, wherein a distribution of ions is depicted based on a grey scale. At the interface 620 of the superionic material 611 and the active material 612, there exists a high concentration of ions, which gradually reduces when extending in the direction of arrow 626 towards electrode 630. Such ion concentration gradient provides for conductivity in the device. Subsequently, at FIG. 6c when the polarity is reversed to obtain an erase threshold, a depletion region is created at 625, and high concentration of ions further move to the right at 627 (the dark band moves further to the right). Such provides a high resistance, typically not because of a lack of ions but due to a depletion region being created at 625. Gradually, or as a stronger voltage is applied, the high concentration of ions can exit the active layer. For example, as depicted in FIG. 6d a high voltage can cause a hard erase of the switchable diode integrated with the memory device, to create a high resistance therein.

Figure 7:
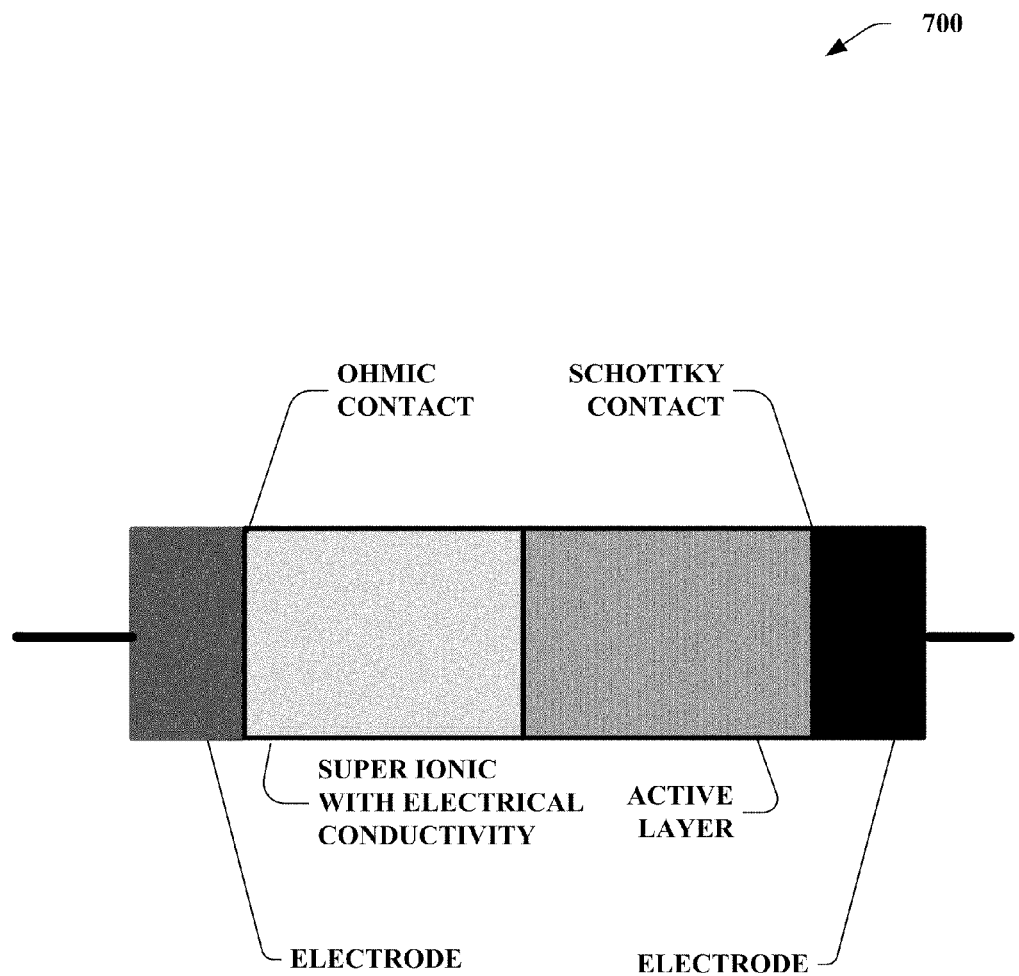
FIG. 7 illustrates a memory cell with a switchable diode integrated therewith in an off state that employs a Schottky contact, in accordance with an embodiment.

FIG. 7 illustrates a memory cell with a switchable diode integrated therewith in an off state that employs a Schottky contact, in accordance with an embodiment. Typically, such can facilitate obtaining suitable diodic junctions when semiconductor material (e.g., intrinsic or lightly doped) are employed. For example, such a Schottky contact can provide for a superior design flexibility, wherein a variety of materials can be used in order to tailor desirable characteristics, e.g., obtaining desirable electrical properties, work functions, barriers and the like, when employing an active layer with intrinsic or lightly doped semiconductor material.

Figure 8:
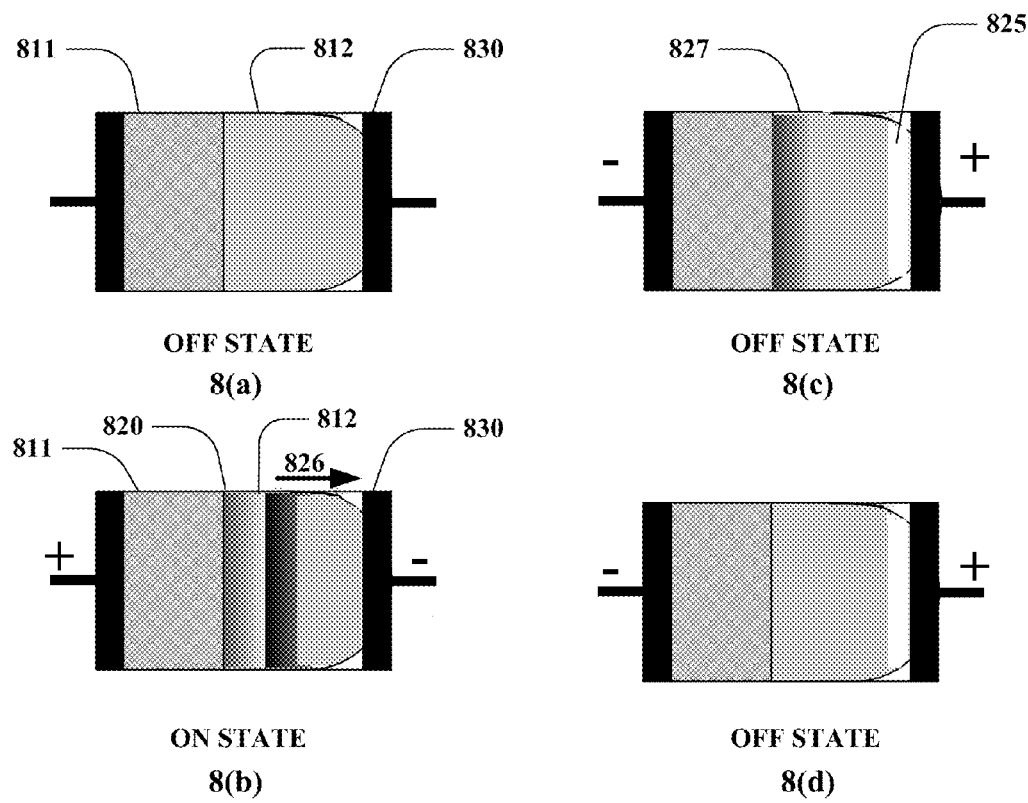
FIGS. 8a thru 8d illustrate concentration of ions at the various stages of operation for the switchable diode with Schottky contact illustrated in FIG. 7, in accordance with an embodiment.
Figure 8:
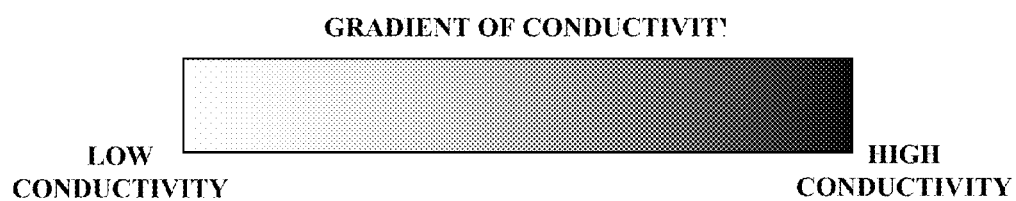

The operational sequence for the switchable Schottky diode is illustrated in FIGS. 8a-8d, wherein the concentration of ions at the various stages of operation is shown with a grey scale. The supply and exchange of ions primarily occurs at the interface between the Schottky contact (electrode 830) and the active layer 812. FIG. 8a illustrates a concentration of ions in an OFF state, after an initialization process that can invite a limited amount of ions in the active layer. Subsequently, the device is brought into an ON state at 8b, wherein a distribution of ions is depicted based on a grey scale. At the interface 820 of the superionic material 811 and the passive material 812, there exists a high concentration of ions, which gradually reduces when extending in the direction of arrow 826 towards electrode 830. Such ion concentration gradient provides for conductivity in the device. Subsequently, at FIG. 8c when the polarity is reversed to obtain an erase threshold, a depletion region is created at 825, adjacent to the Schottky contact and high concentration of ions further move to the left at 827 (the dark band moves further to the left). Gradually, or as a stronger voltage is applied, the high concentration of ions can exit the active layer. For example, as depicted in FIG. 8d a high voltage can cause a hard erase of the switchable diode integrated with the memory device, to create a high resistance therein.

Figure 9:
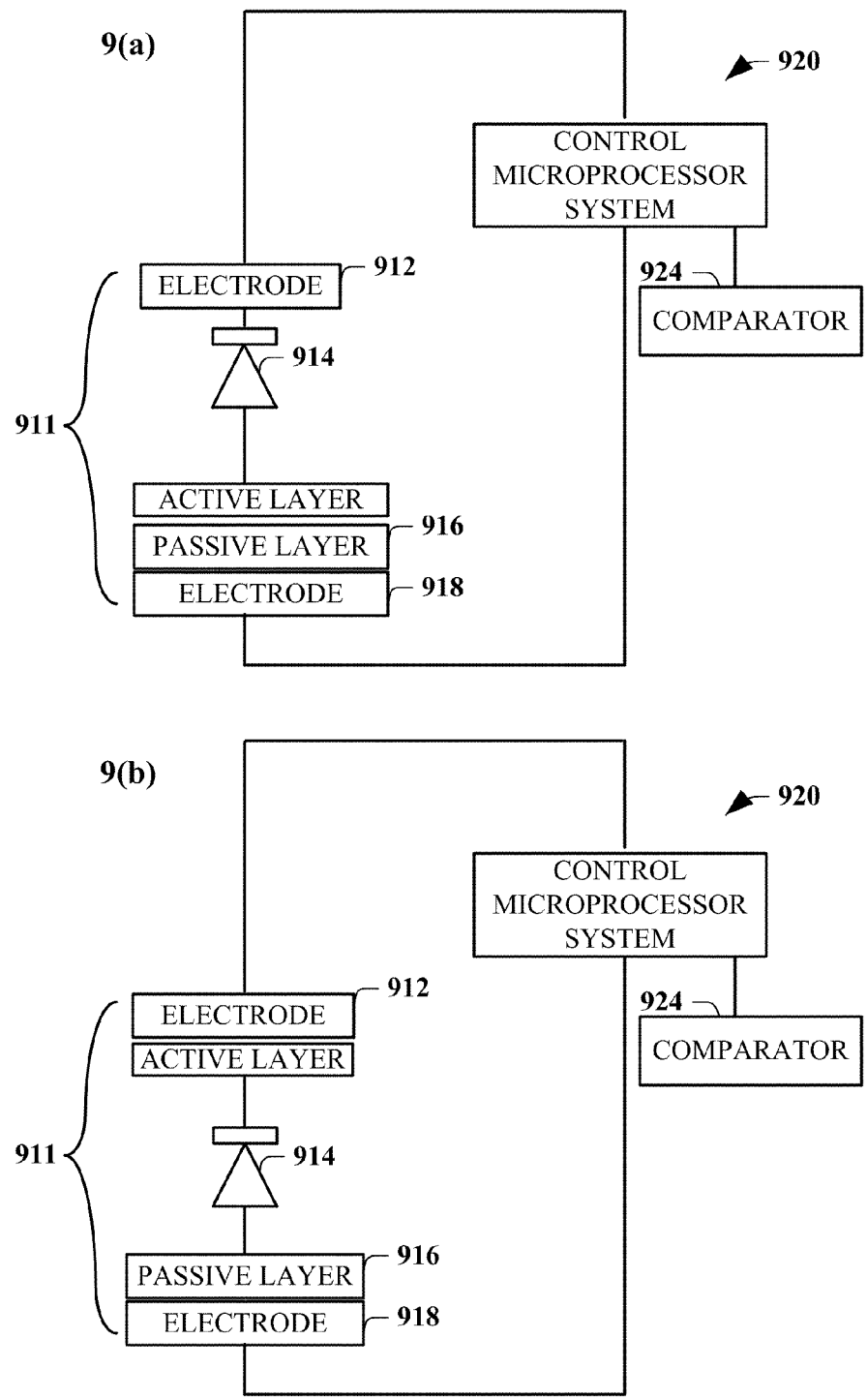
FIGS. 9a thru 9b illustrate a schematic programming system for various configurations of a memory cell with a diode integral therewith, in accordance with an embodiment.

FIGS. 9a thru 9b illustrate a schematic programming system for various configurations of a memory cell 911, as part of an array (not shown), having a diode 914 integral therewith, with a control microprocessor system 920—in accordance with an embodiment. The control system 920 can be part of a suitably programmed general purpose computer of a network and can also be implemented by employing a plurality of separated and/or dedicated programmable integrated circuits or other logic devices. Various information display devices (e.g. monitors, displays and the like), as well as user input devices can be operatively connected to the input/output of such processor. The control system 920 can actively trace and control a program state of the memory cell 911. For example, the microprocessor system 924 can provide a programming signal, e.g., a voltage applied to the memory element 911, and detect an ensuing electric current that flows through it. When such current is detected to be at a predetermined value that represents a particular resistance of the memory element 911, the voltage can be removed, and programming stopped. Such can be accomplished by comparing the current via a comparator 924 to reference values. Accordingly, the memory cell 911 can be programmed to a predetermined state.

Typically for such a memory cell, upper and lower electrodes (912, 918) sandwich various other active, and passive layers, which can also include various light emitting material, such as: light emitting structure, photo resistance, or photo sensors. The electrodes (e.g. 912, 918) can be comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. As illustrated, the diode 914 can be formed at any location between electrodes 912, and 918.

The thickness of the electrodes can vary depending on the implementation and the memory device being constructed. However, some exemplary thickness ranges include about 0.01 m or more and about 10 m or less, about 0.05 m or more and about 5 m or less, and/or about 0.1 m or more and about 1 m or less. The electrodes can be placed in an alternating fashion among various layers of, for example, semiconductor layers, polymer layers, and passive layers.

Figure 10:
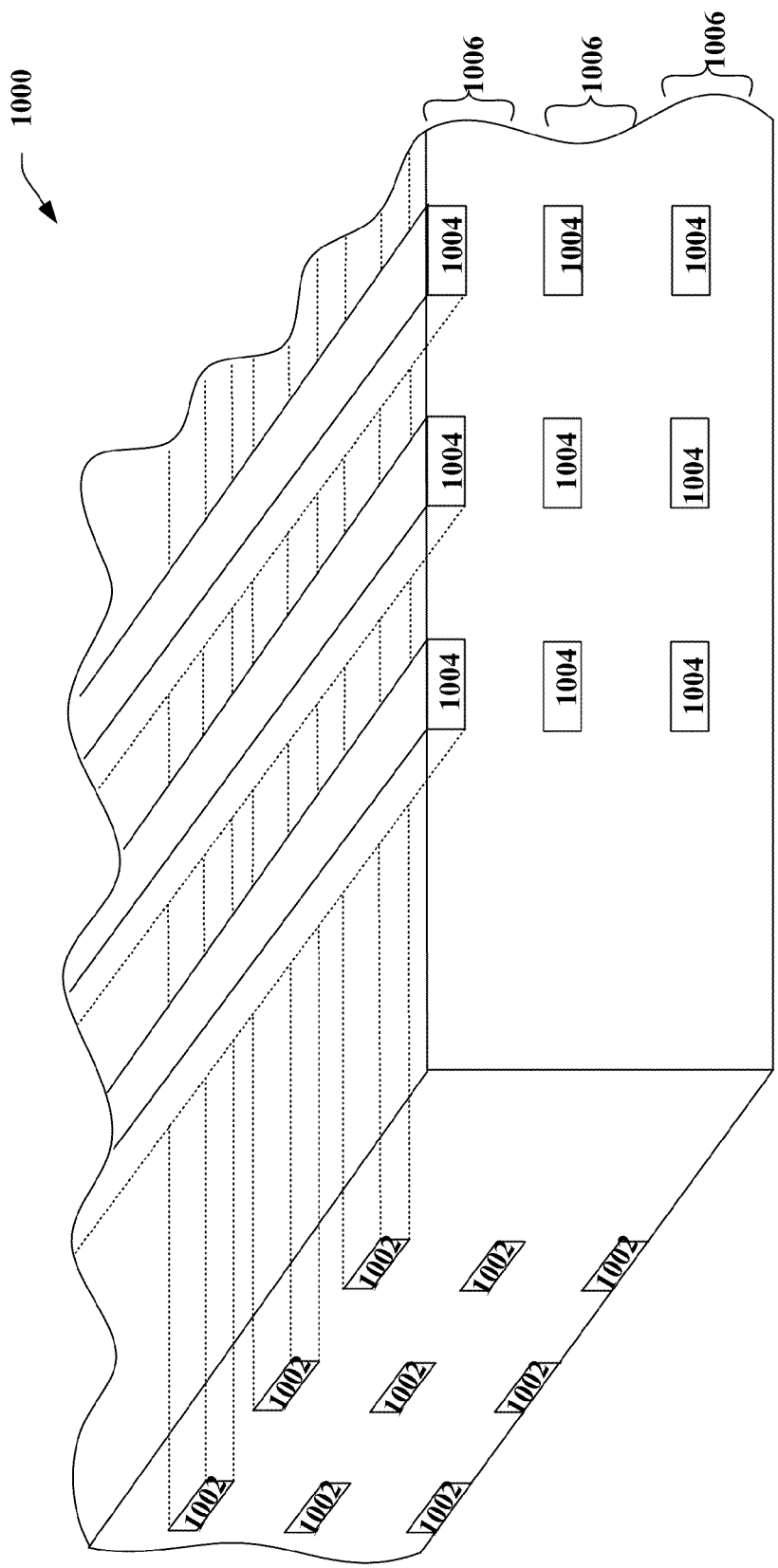
FIG. 10 is a view of a memory device with integral diodes as part of memory cells, which employs various electrode lines in a crossed shape, in accordance with an embodiment.

Referring to FIG. 10, a three dimensional view of a memory device 1000 containing a plurality of memory cells with integral diodes arranged in accordance with an aspect of the invention is shown. The memory device 1000 contains a plurality of electrodes 1002, a plurality of second electrodes 1004, wherein memory cell arrangements 1006, employing passive and active material with integral diodes as discussed supra, can be fabricated therebetween. The plurality of electrodes 1002 and 1004 are shown in substantially perpendicular orientation, although other orientations are possible. Such a microelectronic memory device is capable of containing an extremely high number of memory cells and at the same time facilitating creation of a passive array, wherein memory cells can be isolated from one another, and individually programmed.

Such memory cells with integral diodes can be employed in typically any device requiring memory. For example, the memory devices with integral diodes are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the memory devices. Examples of hand-held devices include cell phones and other two way communication devices, personal data assistants, palm pilots, pagers, notebook computers, remote controls, recorders (video and audio), radios, small televisions and web viewers, cameras, and the like.

Figure 11:
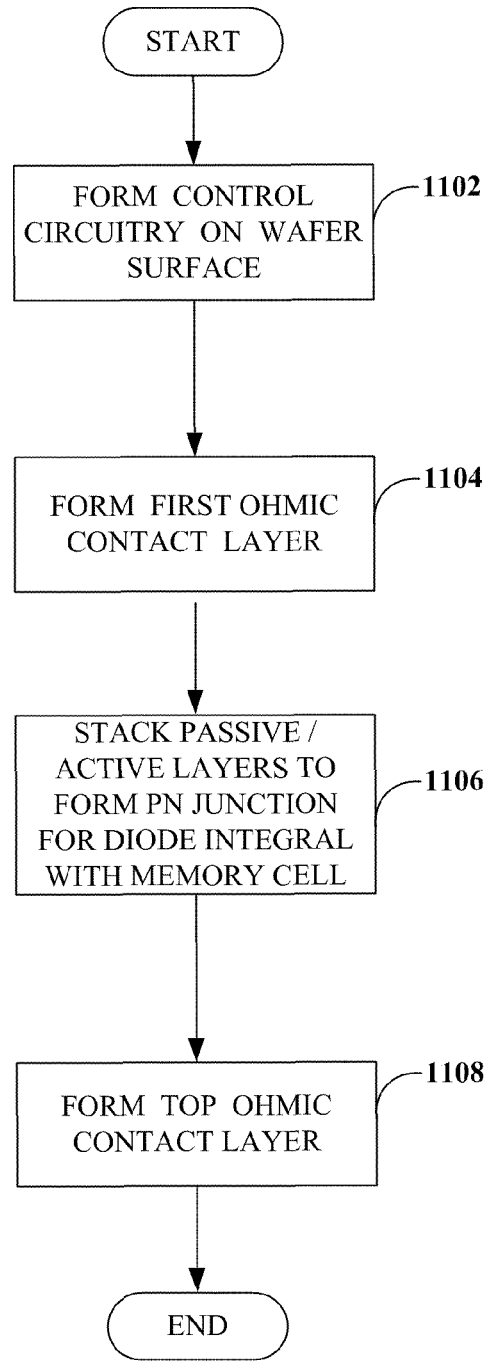
FIG. 11 illustrates a flow chart for a methodology, in accordance with an embodiment.

FIG. 11 illustrates a methodology according to one aspect of the subject disclosure. While the exemplary method is illustrated and described herein as a series of blocks representative of various events and/or acts, the subject disclosure is not limited by the illustrated ordering of such blocks. For instance, some acts or events may occur in different orders and/or concurrently with other acts or events, apart from the ordering illustrated herein, in accordance with the invention. In addition, not all illustrated blocks, events or acts, can be required to implement a methodology in accordance with the subject disclosure. Moreover, it will be appreciated that the exemplary method and other methods according to the invention can be implemented in association with a deposition and etch process for integrated circuit (IC) fabrication, and/or a damascene fill and polish procedure as well as in association with other systems and apparatus not illustrated or described.

Initially, a control component circuitry, as described in detail supra, can be deposited on a wafer surface at 1102. Such control component can facilitate a programming of various memory cells employed as part of an array of memory cells of the subject disclosure. Next, a bottom ohmic contact layer can be deposited at 1104, e.g., as part of an interconnect line as described in detail supra, which can act as a lower electrode for memory cells as part of the array. At 1106, various layers of passive media and active media, with asymmetrical pn characteristics, are deposited to form a diode junction integral to the memory cell. At 1108, and over such stacked layers, a top ohmic contact layer can be deposited over such stacked layers, e.g., as part of an interconnect line to connect such memory cell with other parts of a memory cell array circuit.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention. Furthermore, to the extent that the terms "includes", "including", "has", "having", and variants thereof are used in either the detailed description or the claims, these terms are intended to be inclusive in a manner similar to the term "comprising."

What is claimed is:

1. A method comprising:
   forming, in each memory cell of an array of memory cells, a passive layer adjacent to a first ohmic contact layer;
   forming an active layer adjacent to the passive layer, wherein
      one of the active layer and the passive layer is composed of a P-type material and one of the active layer and the passive layer is composed of an N-type material such that combining the layers forms a diodic junction; and
   forming a second ohmic contact layer adjacent to the active layer.

2. The method of claim 1, further comprising:
   forming electrode contacts at the first and second ohmic contact layers.

3. The method of claim 1, further comprising:
   forming the active layer via a chemical vapor deposition (CVD) process.

4. The method of claim 1, further comprising:
   forming the active layer via a gas phase reaction process.

5. The method of claim 1, further comprising:
   forming the active layer via a spin coating process.

6. The method of claim 1, further comprising:
   forming the active layer via a liquid phase reaction process.

7. The method of claim 1, further comprising:
   forming the first and second ohmic contact layers via a deposition process comprising at least one of: vacuum thermal evaporation, sputtering, or plasma enhanced chemical vapor deposition (PECVD) utilizing a metal organic (MO) precursor.

8. The method of claim 1, further comprising:
   forming the passive layer via a deposition process comprising at least one of: thermal deposition, physical vapor deposition (PVD), non-selective chemical vapor deposition (CVD), or complete sulfidation of a pre-deposited thin copper layer.

9. The method of claim 1, wherein forming the active layer comprises:
   depositing a conductivity facilitating compound on the passive layer.

10. A method comprising:
    forming a first electrode on a substrate associated with a memory device;
    forming a passive layer on the first electrode;
    forming an active layer on the passive layer, wherein
       one of the active layer and the passive layer is composed of a P-type material and one of the active layer and the passive layer is composed of an N-type material such that combining the layers forms a diodic junction; and
    forming a second electrode on the active layer.

11. The method of claim 10, further comprising:
    doping the active layer to adjust threshold properties of the diodic p/n junction.

12. The method of claim 10, further comprising:
    forming ohmic contact layers at the first and second electrodes.

13. The method of claim 12, further comprising:
    depositing the passive layer upon an ohmic contact layer via at least one of:
    vacuum thermal evaporation, sputtering, or plasma enhanced chemical vapor deposition (PECVD) utilizing a metal organic (MO) precursor.

14. The method of claim 10, further comprising:
    depositing a conductivity facilitating compound on the passive layer.

15. The method of claim 10, further comprising:
    forming the active layer via at least one of:
    a chemical vapor deposition (CVD) process;
    a gas phase reaction process;
    a spin coating process; or
    a liquid phase reaction process.

16. The method of claim 10, further comprising:
    forming the passive layer via a deposition process comprising at least one of: thermal deposition, physical vapor deposition (PVD), non-selective chemical vapor deposition (CVD), or complete sulfidation of a pre-deposited thin copper layer.

* * * * *